United States Patent [19]
Shaheen et al.

[11] Patent Number: 5,123,164
[45] Date of Patent: Jun. 23, 1992

[54] HERMETIC ORGANIC/INORGANIC INTERCONNECTION SUBSTRATE FOR HYBRID CIRCUIT MANUFACTURE

[75] Inventors: Joseph M. Shaheen, La Habra; James S. Yamaguchi, Lake Forest, both of Calif.

[73] Assignee: Rockwell International Corporation, Seal Beach, Calif.

[21] Appl. No.: 615,667

[22] Filed: Nov. 19, 1990

Related U.S. Application Data

[62] Division of Ser. No. 448,190, Dec. 8, 1989, Pat. No. 5,030,499.

[51] Int. Cl.$^5$ .............................................. H01K 3/10
[52] U.S. Cl. ........................................ 29/852; 174/262; 228/179; 228/180.1; 427/97
[58] Field of Search .................... 29/852, 830; 427/97; 228/179, 180.1; 174/262; 264/61

[56] References Cited

U.S. PATENT DOCUMENTS

| | | |
|---|---|---|
| 4,169,001 | 9/1979 | Kaiser . |
| 4,191,789 | 3/1980 | Brown et al. ............... 29/852 X |
| 4,299,873 | 11/1981 | Ogihara et al. . |
| 4,323,593 | 4/1982 | Tsunashima ............... 29/852 X |
| 4,368,503 | 1/1983 | Kurosawa et al. . |
| 4,388,136 | 6/1983 | Huie et al. . |
| 4,434,134 | 2/1984 | Darrow et al. ............... 29/852 X |
| 4,464,704 | 8/1984 | Huie et al. . |
| 4,478,882 | 10/1984 | Roberto . |
| 4,642,148 | 3/1987 | Kurihara et al. . |
| 4,683,653 | 8/1987 | Iwasa . |
| 4,696,851 | 9/1987 | Pryor . |
| 4,732,780 | 3/1988 | Mitoff et al. ............... 29/852 X |
| 4,733,461 | 3/1988 | Nakano . |
| 4,736,521 | 9/1988 | Dohya . |
| 4,740,414 | 4/1988 | Shaheen . |
| 4,788,766 | 12/1988 | Burger et al. . |
| 4,795,670 | 1/1989 | Nishigaki et al. . |
| 4,802,945 | 2/1989 | Opina . |
| 4,803,450 | 2/1989 | Burgess et al. . |
| 4,880,684 | 11/1989 | Boss et al. ............... 29/852 X |
| 4,908,940 | 3/1990 | Amano et al. ............... 29/852 |
| 4,964,948 | 10/1990 | Reed ............... 29/852 X |

*Primary Examiner*—Carl J. Arbes
*Attorney, Agent, or Firm*—H. Fredrick Hamann; George A. Montanye; Tom Streeter

[57] ABSTRACT

The present invention eliminates the release of vapors from an adhesive which bonds an organic multilayer substrate to a ceramic layer. Posts from the organic layer are plated up sufficiently high as to enter holes in the ceramic layer, but not completely penetrate through them. The holes may then be filled with solder, which both seals the holes against the escape of adhesive vapors and makes a good electrical contact with the post. A conductive pad may then be stenciled on top of the solder plug, and the chip or other electric component mounted to the pad. The hole is preferably plated with a conductive material prior to being filled with solder, so that solder may join the plating with the post. The solder plug is formed by forming a slurry of solder with alcohol, which is squeegeed into the holes and fused under pressure. A solder paste is then stenciled over the fused soldered power and is, itself, fused using the vapor phase. A plurality of interconnection substrates may be formed from a single organic/inorganic panel, broken or sawed apart along score lines.

11 Claims, 2 Drawing Sheets

HERMETIC ORGANIC/INORGANIC INTERCONNECTION SUBSTRATE FOR HYBRID CIRCUIT MANUFACTURE

This is a divisional application of copending application Ser. No. 07/448,190 filed on Dec. 8, 1989, U.S. Pat. No. 5,030,499, Feb. 9, 1991.

BACKGROUND OF THE INVENTION

This invention relates to substrates for electronic circuit boards, and has particular relation to multilayer circuit boards containing an organic layer and an inorganic layer, such as ceramic.

Ceramic has many advantages over organic materials when being used as a circuit board substrate. Its coefficient of thermal expansion more closely approximates that of the chips which are to be bonded to the substrate, and it allows a greater density of chips to be bonded to the substrate. However, it is both expensive and difficult to work, especially to drill holes in. Organic substrates are both cheap and easy to drill. It is therefore desirable to combine the advantages of both organic and inorganic substrates into a hybrid substrate, while avoiding the disadvantages of each.

SUMMARY OF THE INVENTION

In the present invention, all of the layers of the multilayer substrate, other than the outer layer, are organic layers; the outer layer is the only ceramic layer. Posts are formed, typically by plating up, from the central organic multilayer substrate into corresponding holes in the ceramic substrate. A layer of adhesive bonds the ceramic board to the organic substrate.

Adhesive is necessary to bond the ceramic and organic substrates together, but is volatile. The fumes from the adhesive can escape through the holes in the ceramic, and can then damage the chips or other electronic components mounted on the ceramic. For this reason, expensive and complex chip carriers have been designed to protect the chip from the fumes, and from other hazards.

The present invention eliminates the release of vapors through the holes by plating up the posts sufficiently high as to enter the hole, but not so high as to completely penetrate through it. The hole may then be plugged with solder, which both seals the hole against the escape of adhesive vapors and makes a good electrical contact with the post. A conductive pad may then be stenciled on top of the solder plug, and the chip or other electric component mounted to the pad. The hole is preferably plated with a conductive material prior to being filled with solder, so that the solder may electrically join the plating and the post.

Forming the solder plug is, itself, a technical process. Applicants have developed a technique of forming a slurry of solder with alcohol, which is squeegeed into the holes and fused under pressure. A solder paste is then stenciled over the fused soldered powder and is, itself, fused using the vapor phase.

The ceramic layer, with hermetically sealed holes, may substitute for the bottom portion of a chip carrier. If the only hazard to the chips is from the adhesive vapors, no further protection is required. If there are other hazards, an inexpensive lid may be placed over the chips and bonded directly to the ceramic layer, without going to the trouble and expense of providing a chip carrier.

The present invention is well suited to fabricating a multiplicity of hybrid interconnection substrates from a single panel. A relatively large panel, comprising an organic layer and a ceramic layer as described above, is formed in smaller sections, without electrical connection between the sections. The boundaries of the sections are formed by score lines in the ceramic. When the entire panel has been formed and fired, it may be broken apart on the score lines, or sawed apart along said lines, thereby forming individual interconnection substrates.

It is an objective of the present invention to join the advantages of organic and inorganic electronic substrates, while avoiding their disadvantages.

It is a further objective of the present invention to hermetically seal the organic/inorganic interconnection substrate against vapors from the adhesive which adjoins the inorganic layer to the organic layer.

It is a feature of the present invention that only the external layer of the interconnection board need be inorganic; the internal layers may all be organic.

It is a further feature of the present invention that the cost of the board is substantially reduced, while maintaining only inorganic contact with the chips.

These and other objectives and features are apparent in view of the following description of particular embodiments of the present invention.

DETAILED DESCRIPTION OF THE INVENTION

Figure 1:
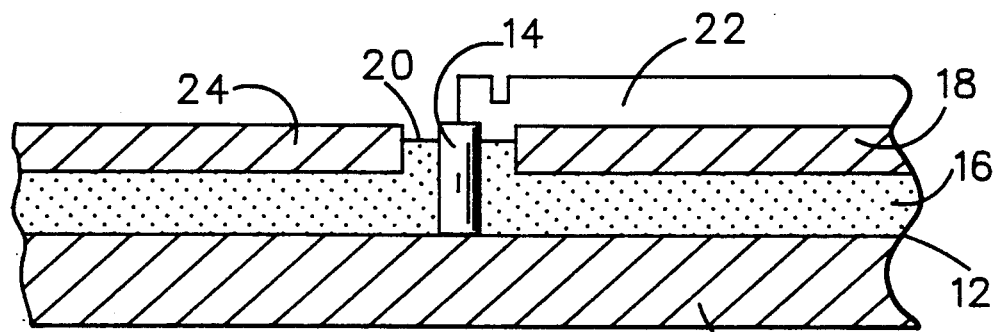
FIG. 1 is a cross sectional view of an embodiment of a non-hermetic ceramic/organic interconnection substrate.

Turning now to FIG. 1, a cross sectional view of one embodiment of a non-hermetic ceramic/organic interconnection substrate is shown. An organic layer 10 has, protruding from its upper surface 12, an electrically conductive post 14. A layer of compliant adhesive 16 covers the upper surface 12, surrounds the post 14, and bonds a ceramic layer 18 to the organic layer 10. The post 14 protrudes through a hole 20 in the ceramic layer 18. Since the thermal coefficient of expansion (TCE) of the ceramic layer 18 is generally quite different from the TCE of the organic layer 10, the diameter of the hole 20 is made somewhat larger than that of the post 14, so as to reduce stress between the ceramic layer 18 and the post 14. An electrically conductive surface trace 22 connects the post 14 to electronic components (not shown) mounted on the upper surface 24 of the ceramic layer 18.

Figure 2:
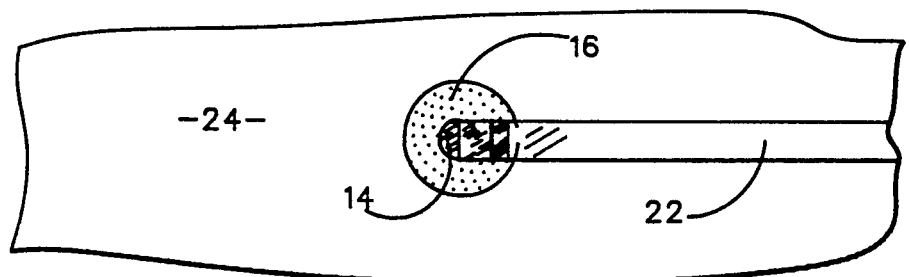
FIG. 2 is a top plan view of the apparatus of FIG. 1.

FIG. 2 shows a top plan view of the apparatus shown in FIG. 1. As is shown in both figures, the trace 22 only partially covers the hole 20, and thus partially exposes the adhesive 16. The adhesive 16 is volatile, and the gasses thus produced may contact the electronic components. In many applications this is acceptable, since the components are not affected by the gasses, or are encased in chip carriers or other hermetic containers, and are thus protected from the gasses thus formed.

Figure 3:
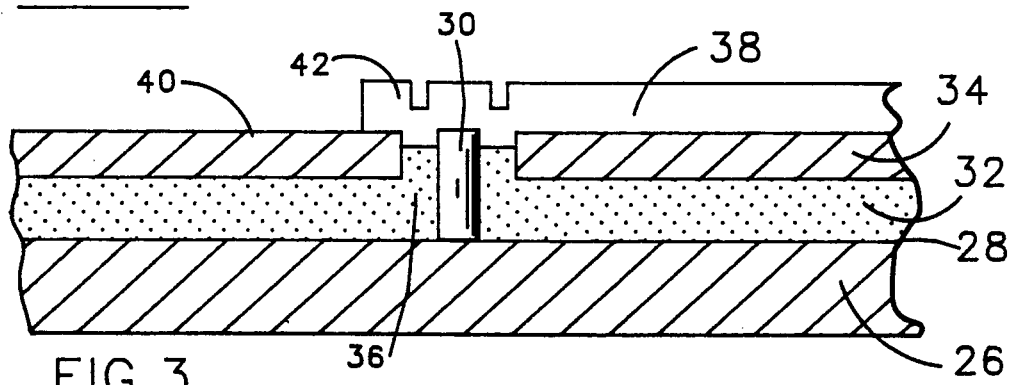
FIG. 3 is a cross sectional view of a second embodiment of a non-hermetic ceramic/organic interconnection substrate.
Figure 4:
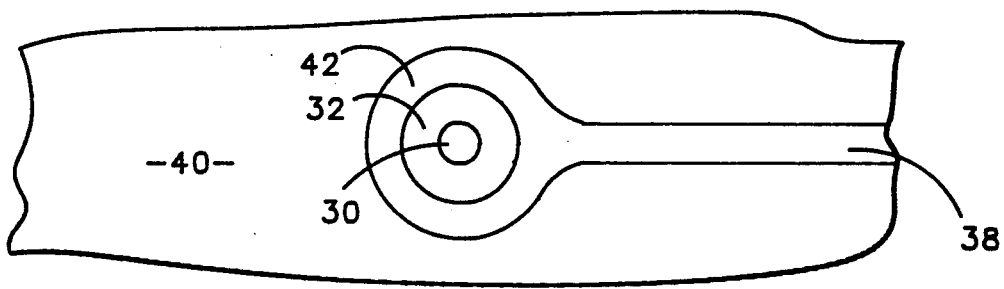
FIG. 4 is a top plan view of the apparatus of FIG. 3.

In some applications, however, it is desired that no gas escape from the adhesive. FIGS. 3 and 4 show one way of doing this. FIG. 3 is comparable to FIG. 1, and FIG. 4 is comparable to FIG. 2. With one exception, the apparatus shown in FIGS. 3 and 4, is the same as that shown in FIGS. 1 and 2, and the various elements of the FIGS. 3 and 4 apparatus have reference numerals which are the same as those of FIGS. 1 and 2, incremented by 16. The exception is an electrically conductive pad 42 which covers the hole 36, and connects the post 30 to the trace 38. The pad 42 prevents gasses from the adhesive 32 from escaping.

It is apparent that the pad 42 of FIGS. 3 and 4 could be eliminated if the trace 38 were made sufficiently wide as to cover the hole 36. This would be wasteful both of material for the trace 38, and of the area of the surface 40 of the ceramic layer 34. It is, accordingly, not preferred except in very limited circumstances.

It is also apparent that trace 22 of FIGS. 1 and 2 could be replaced by a pad similar to pad 42 of FIGS. 3 and 4. This pad, like trace 22, would not have to be so large, and so precisely centered, as to completely cover the hole 20. The pad would have to comply with only two requirements. First, it would have to make good electrical contact with the post 14. Second, it would have to cover a large enough portion of the upper surface 24 of the ceramic layer 22 as to allow an electronic component to be mounted on that portion of the upper surface 24 and make good electrical contact with the pad. The post 14 would have to be positioned under the planned location of the electronic component, of course, but this is relatively straightforward, since the layer 10 is organic.

The apparatus shown in FIGS. 3 and 4 is suitable for low density applications. In high density applications, however, the pads 42 consume too great a fraction of the area of the surface 42, and thus place an unreasonably low limit on the number of electronic components which can be mounted on the ceramic layer 34, and on the traces 38 which connect them with one another and with the organic layer 26. In such applications, the apparatus shown in FIGS. 5 and 6 is more suitable.

Figure 5:
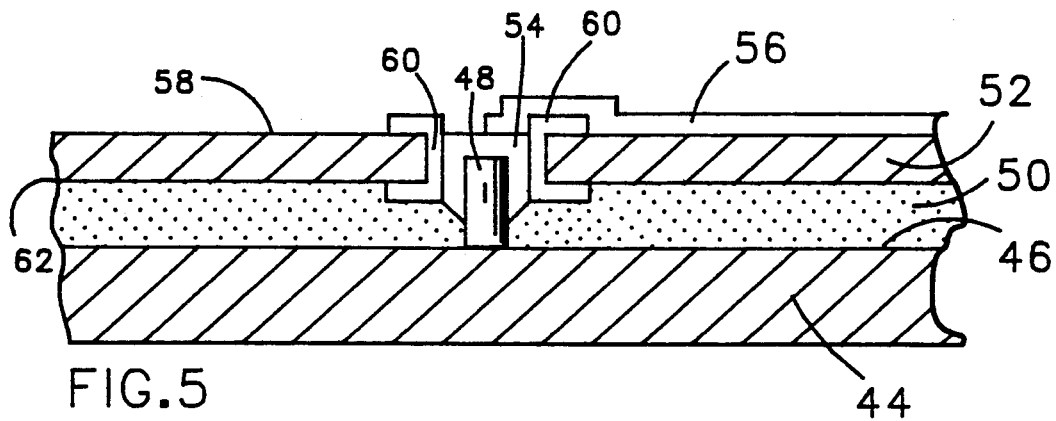
FIG. 5 is a cross sectional view of an embodiment of an hermetic ceramic/organic interconnection substrate.
Figure 6:
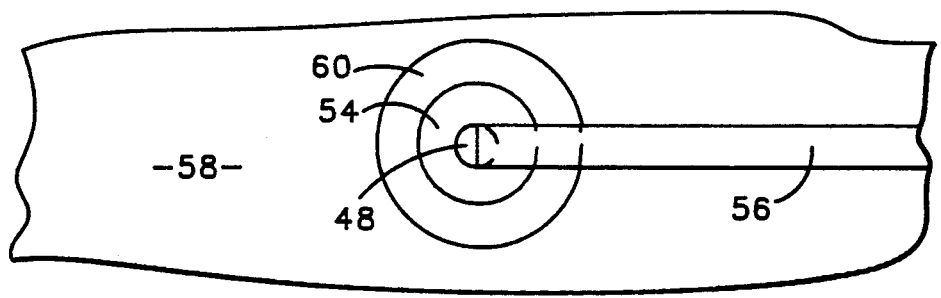
FIG. 6 is a top plan view of the apparatus of FIG. 5.

FIG. 5 is comparable to FIGS. 1 and 3; and FIG. 6 is comparable to FIGS. 2 and 4. The organic layer 44, organic layer top surface 46, post 48, adhesive 50, ceramic layer 52, hole 54, trace 56, and ceramic layer upper surface 58 are all as described in the apparatus of FIGS. 1 and 2, and the apparatus of FIGS. 3 and 4. However, while the post 48 enters the hole 54, it does not penetrate through the hole 54 to or above the upper surface 58 of the ceramic layer 52.

Such penetration of the post 14 was desirable in FIGS. 1 and 2 to insure good contact with the trace 22, and was likewise desirable of the post 30 in FIGS. 3 and 4 to insure good contact with the pad 42. It is not desirable in the apparatus of FIGS. 5 and 6, because, in this apparatus, the hole 54 is filled with solder, the solder melted, and the trace 56 attached to the solder. If desired, the hole 54 may first be plated with a conductive plating 60. If such a plating 60 is deposited on the hole 54, the trace 56 may be attached to the plating 60, to the solder, or to both.

The post 48 is of reduced height primarily so as not to interfere with the filling of the hole 54 with solder. However, reduced height has the desirable side effect that a short post 48 may be plated up in less time than a tall post 48, thereby increasing production rates.

The preferred method of fabrication is to first plate up the post 48 from the upper surface 46 of the organic layer 44. Concurrently, the ceramic layer 52 is fired, and the holes 54 are drilled (preferably by laser drilling) and plated with plating 60. The adhesive 50 is then applied to the upper surface 46 of the organic layer 44, to the lower surface 62 of the ceramic layer 52, or to both. The posts 48 are then aligned with the holes 54, the organic layer 44 and ceramic layer 52 are pressed together, and the adhesive 50 is cured. As with the apparatus of FIGS. 1 and 2, and the apparatus of FIGS. 3 and 4, the trace 56 is not strictly necessary. A pad, similar to the pad 42 of FIGS. 3 and 4, may be deposited over the post 48, solder 54, and plating 60. Since hermeticity has already been assured by the solder 54 (and plating 60, if applicable), the pad need not be precisely positioned, nor need it be excessively large, in order to assure hermeticity on its own. Instead, it need only have the position precision and size necessary to make good electrical contact with the solder 54 (and plating 60, if applicable), and to cover a large enough portion of the upper surface 58 of the ceramic layer 52 as to allow an electronic component to be mounted on that portion of the upper surface 58 and to make good electrical contact with the pad. Also, as with the previously described apparatus, the post 48 will have to be positioned under the planned location of the electronic component, but this is, as before, relatively straightforward, since the layer 44 is organic.

A 63 wt % Sn/37 wt % Pb solder powder, formed in an alcohol slurry, is then squeegeed into the holes 54 and fused under pressure in an hydraulic press heated to 475 degrees F. for 15 minutes. A 63 wt % Sn/37 wt % Pb solder paste is then stenciled over the fused solder powder. The combination is then fused in vapor phase for 1 minute at 422 degrees F. The traces 56 and electronic components may then be attached to the ceramic layer 52 by any convenient means. The solder plug thus formed simultaneously provides a good electrical connection between the post 48 and the trace 56, and prevents vapors from the adhesive 50 from escaping through the hole 54.

If desired, a lid (not shown) may be placed over the upper surface 58 of the ceramic layer 52, thereby hermetically sealing the traces 56 and electronic components from environmental contamination as well as from contamination by adhesive vapors. No chip carrier is required.

Figure 7:
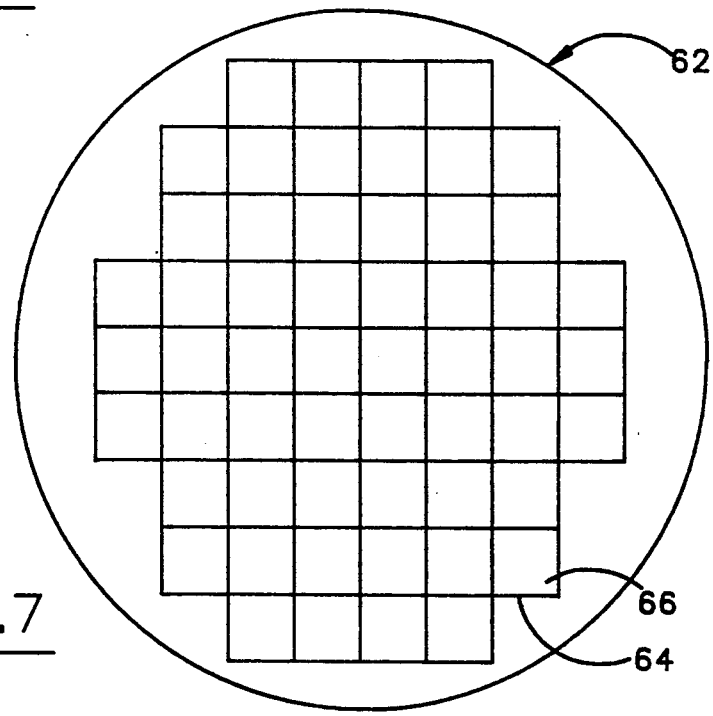
FIG. 7 is a top plan view of a relatively large panel, which may be broken apart to form individual interconnection substrates.

FIG. 7 shows a relatively large panel 62, which is subdivided by score lines 64 into a multiplicity of interconnection substrates 66. The entire panel may be formed as a unit in accordance with the preceding description. When the ceramic layer has been fired and has cooled, the panel may be broken or sawed apart along the score lines to form individual interconnection substrates. The hermetic solder may be inserted into the holes either before or after the panel is broken into individual interconnection substrates. Likewise, discrete components may be connected to the ceramic surface, and lids may be placed over said connected components, either before or after the panel is broken apart into individual interconnection substrates.

INDUSTRIAL APPLICABILITY

The present invention is capable of exploitation in industry, and can be used, whenever it is desired to prevent the escape of gasses from adhesive used to bind together an organic/inorganic interconnection substrate. It can be made of any convenient pair of organic and inorganic materials.

While particular embodiments have been described herein, the true spirit and scope of the present invention is not defined thereby, but by the appended claims.

What is claimed is:

1. A method of forming an hermetic, conductive plug in a hole, the method comprising:
    forming a solder powder and a carrier into a slurry;
    squeegeeing the slurry into the hole;
    fusing the slurry under pressure at a first temperature for a first period of time;
    stencilling a solder paste over the fused solder powder, thereby forming a combination; and
    fusing the combination using vapor phase at a second temperature for a second period of time.

2. The method of claim 1, wherein the hole is plated.

3. The method of claim 1, wherein the hole is unplated.

4. The method of claim 1, wherein the solder powder is at least approximately 63 wt % Sn/37 wt % Pb.

5. The method of claim 1, wherein the carrier comprises alcohol.

6. The method of claim 1, wherein the pressure is provided by an hydraulic press.

7. The method of claim 1, wherein the first temperature is about 475 degrees F.

8. The method of claim 1, wherein the first period of time is about 15 minutes.

9. The method of claim 1, wherein the solder paste is at least approximately 63 wt % Sn/37 wt % Pb.

10. The method of claim 1, wherein the second temperature is about 422 degrees F.

11. The method of claim 1, wherein the second period of time is about 1 minute.

* * * * *